US010562261B2

(12) United States Patent
Zhang (10) Patent No.: US 10,562,261 B2
(45) Date of Patent: Feb. 18, 2020

(54) DISPLAY DEVICE AND DISPLAY SUBSTRATE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xiaoxia Zhang, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 136 days.

(21) Appl. No.: 15/743,218

(22) PCT Filed: Jan. 8, 2018

(86) PCT No.: PCT/CN2018/071697
§ 371 (c)(1),
(2) Date: Jan. 9, 2018

(87) PCT Pub. No.: WO2019/095537
PCT Pub. Date: May 23, 2019

(65) Prior Publication Data
US 2019/0143631 A1  May 16, 2019

(30) Foreign Application Priority Data

Nov. 16, 2017  (CN) .......................... 2017 1 1163407

(51) Int. Cl.
*B32B 3/26* (2006.01)
*G09F 9/30* (2006.01)
(Continued)

(52) U.S. Cl.
CPC .......... *B32B 3/266* (2013.01); *B32B 2457/20* (2013.01); *G06F 2203/04102* (2013.01);
(Continued)

(58) Field of Classification Search
CPC ................. B32B 3/266; B32B 2457/20; Y10T 428/24298; Y10T 428/24314;
(Continued)

(56) References Cited

U.S. PATENT DOCUMENTS 9,899,626 B2 * 2/2018 Nakada ............... H01L 51/0097
2007/0173031 A1 * 7/2007 Kodaira ............... H01L 27/1266
438/400

(Continued)

FOREIGN PATENT DOCUMENTS

CN       106848107 A     6/2017
CN       106876428 A     6/2017
(Continued)

*Primary Examiner* — David Sample
*Assistant Examiner* — Donald M Flores, Jr.
(74) *Attorney, Agent, or Firm* — Hemisphere Law, PLLC; Zhigang Ma (57) ABSTRACT

A display substrate and a display device are provided. The display substrate includes a display area located inside the display substrate and a barrier layer, located between the display area and a substrate edge of the display substrate, wherein the barrier layer includes at least two rows of first hole sections arranged alternately on a direction from the display area to the substrate edge, each row of the first hole sections includes at least two first hole sections arranged alternately on an extending direction of the substrate edge, wherein a projection of the first hole sections of the adjacent rows on the extending direction of the substrate edge overlaps each other. By practice of the disclosure, the extending of the crack could be effectively avoided, so the product yield could be improved.

12 Claims, 6 Drawing Sheets

(51) Int. Cl.
*H01L 27/32* (2006.01)
*H01L 51/00* (2006.01)
*H01L 51/52* (2006.01)

(52) U.S. Cl.
CPC ............ *G09F 9/301* (2013.01); *H01L 27/323* (2013.01); *H01L 27/3244* (2013.01); *H01L 51/0097* (2013.01); *H01L 51/5281* (2013.01); *H01L 2251/5338* (2013.01); *Y10T 428/24273* (2015.01); *Y10T 428/24298* (2015.01); *Y10T 428/24314* (2015.01)

(58) Field of Classification Search
CPC ............ Y10T 428/24273; G09F 9/301; H01L 51/0097; H01L 51/5281; H01L 2251/5338; H01L 27/323; H01L 27/3244; G06F 2203/04102; G06F 1/13338; G06F 1/133305
See application file for complete search history.

(56) References Cited

U.S. PATENT DOCUMENTS

| | | | | |
|---|---|---|---|---|
| 2009/0066903 | A1* | 3/2009 | Yoshida | G02F 1/1339 349/153 |
| 2014/0232956 | A1* | 8/2014 | Kwon | G02F 1/133305 349/12 |
| 2014/0319474 | A1* | 10/2014 | Kim | H01L 51/5256 257/40 |
| 2015/0036299 | A1* | 2/2015 | Namkung | G02F 1/133345 361/749 |
| 2016/0013253 | A1* | 1/2016 | Lee | C23C 16/50 257/40 |
| 2016/0233248 | A1* | 8/2016 | Kwak | H01L 51/56 |
| 2016/0247981 | A1 | 8/2016 | Yang et al. | |
| 2016/0293884 | A1* | 10/2016 | Zhang | H05B 33/0896 |
| 2016/0315284 | A1* | 10/2016 | Jeon | H01L 51/5256 |
| 2017/0062532 | A1* | 3/2017 | Jeong | H01L 27/3246 |
| 2017/0062534 | A1 | 3/2017 | Jiang et al. | |
| 2017/0077147 | A1* | 3/2017 | Kwon | H05K 1/028 |
| 2017/0294495 | A1* | 10/2017 | Shyu | G06F 3/041 |
| 2018/0165996 | A1* | 6/2018 | Ochi | G09F 9/30 |

FOREIGN PATENT DOCUMENTS

| | | |
|---|---|---|
| CN | 206282861 U | 6/2017 |
| CN | 106992263 A | 7/2017 |
| CN | 106997930 A | 8/2017 |
| CN | 107910296 A | 4/2018 |

* cited by examiner

DISPLAY DEVICE AND DISPLAY SUBSTRATE

RELATED APPLICATIONS

The present application is a National Phase of International Application Number PCT/CN2018/071697, filed Jan. 8, 2018, and claims the priority of China Application 201711163407.6, filed Nov. 16, 2017.

FIELD OF THE DISCLOSURE

The disclosure relates to a display technical field, and more particularly to a display device and a display substrate.

BACKGROUND

Nowadays, the flexible display device has become a research hotspot in the display industry due to its characteristics of being bendable, impact-resistant and easy to wear. The appearance of a flexible display panel enables diversified designs of mobile phones. However, there are still some problems in the manufacturing process of the flexible display panel that affect the production yield. When a mother substrate is cut into a single substrate, many cracks are generated at the edge of the substrate. Therefore, when the flexible panel is bent or folded, due to the external force, the cracks may extend toward the interior of the substrate and extend to the circuit area or even the active area, so that the panel cannot emit light normally and the production yield is reduced.

In order to prevent the cracks from extending to the interior of the display substrate, it is common practice in the prior art to dredge the brittle inorganic material beside the cutting line. Due to the needs of the package, the inorganic materials cannot be dredged entirely. Therefore, at a safe distance from the cutting line, the inorganic material with high brittleness will be dredged and the organic design with little fragility will fill in to form an inorganic empty slot to prevent the cracks from extending.

However, during the actual manufacturing process, the inorganic materials may not be etched cleanly, which may reduce the effect of the crack prevention and the product yield is still not high.

SUMMARY

A technical problem to be solved by the disclosure is to provide a display device and a display substrate, so the crack prevention could be achieved, and the production yield could be improved.

To achieve the above object, according to one aspect, the embodiment of the disclosure provides a display substrate, including:
  a display area, located inside the display substrate; and
  a barrier layer, located between the display area and a substrate edge of the display substrate;
  wherein the barrier layer includes at least two rows of first hole sections arranged alternately on a direction from the display area to the substrate edge, each row of the first hole sections includes at least two first hole sections arranged alternately on an extending direction of the substrate edge,
  wherein a projection of the first hole sections of the adjacent rows on the extending direction of the substrate edge overlaps each other, the barrier layer is configured to prevent a crack formed on the substrate edge from extending to the display area,
  wherein the crack between two of the first hole sections adjacent to each other in the same row extending to the display area is blocked by the first hole sections of the adjacent row, the barrier layer is made of an inorganic material, and the first hole sections are further filled with an organic material.

According to another aspect, the embodiment of the disclosure provides a display substrate, including:
  a display area, located inside the display substrate; and
  a barrier layer, located between the display area and a substrate edge of the display substrate;
  wherein the barrier layer includes at least two rows of first hole sections arranged alternately on a direction from the display area to the substrate edge, each row of the first hole sections includes at least two first hole sections arranged alternately on an extending direction of the substrate edge,
  wherein a projection of the first hole sections of the adjacent rows on the extending direction of the substrate edge overlaps each other.

According to another aspect, the embodiment of the disclosure provides a display device, including:
  a display substrate, including:
    a display area, located inside the display substrate; and
    a barrier layer, located between the display area and a substrate edge of the display substrate;
    wherein the barrier layer includes at least two rows of first hole sections arranged alternately on a direction from the display area to the substrate edge, each row of the first hole sections includes at least two first hole sections arranged alternately on an extending direction of the substrate edge, wherein a projection of the first hole sections of the adjacent rows on the extending direction of the substrate edge overlaps each other.

The beneficial effects of the disclosure are as follows, compare to the conventional technology, the embodiments of the disclosure provide a display substrate with a barrier layer including at least two rows of first hole sections, and a projection of the first hole sections of the adjacent rows on the extending direction of the substrate edge overlaps each other. Therefore, even one of first hole sections not be etched cleanly, the adjacent first hole section could make up to achieve the crack prevention, and the production yield could be improved.

DETAILED DESCRIPTION OF PREFERRED EMBODIMENTS

Figure 1:
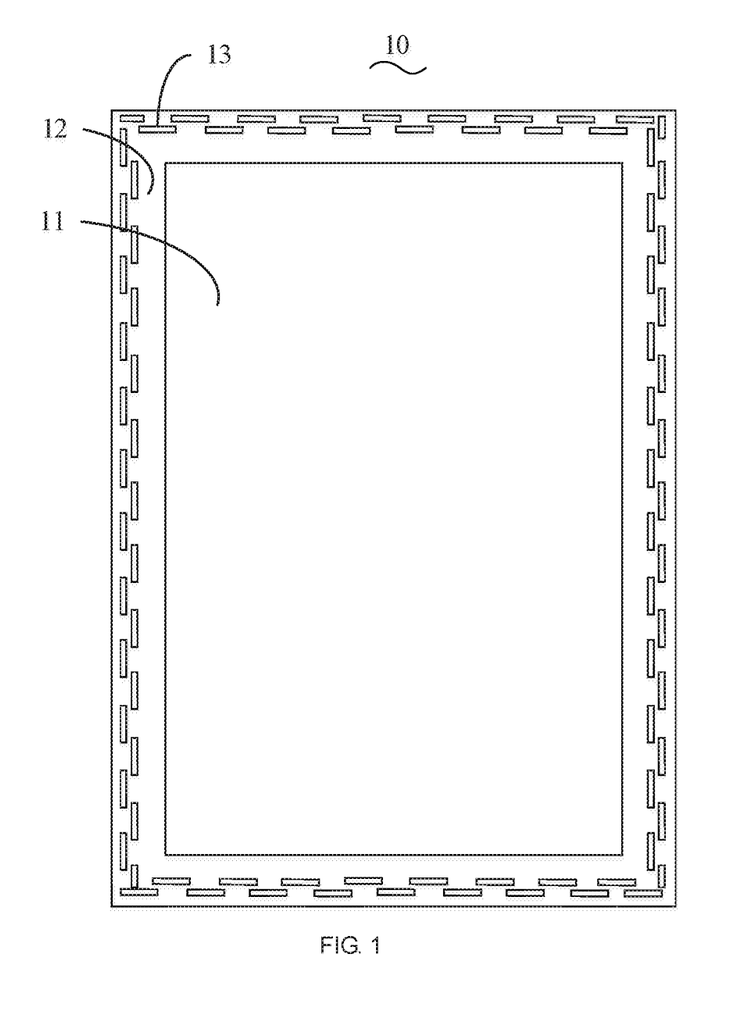
FIG. 1 is a structural schematic view of a display substrate according to the first embodiment of the disclosure.

As shown in FIG. 1, FIG. 1 is a structural schematic view of a display substrate according to the first embodiment of the disclosure. In this embodiment, the display substrate 10 includes a display area 11 and a barrier layer 12.

The display area 11 is located inside the display substrate 10, the barrier layer 12 is located between the display area 11 and a substrate edge of the display substrate 10. Wherein the barrier layer 12 includes two rows of first hole sections 13 arranged alternately on a direction from the display area 11 to the substrate edge, each row of the first hole sections 13 includes at least two first hole sections 13 arranged alternately on an extending direction of the substrate edge, and a projection of the first hole sections 13 of the adjacent rows on the extending direction of the substrate edge overlaps each other.

In this embodiment, the first hole sections 13 are in a straight-line shape. In other embodiment, the shape of the first hole sections 13 is not limited, the shape of the first hole sections 13 could be etched into any shape according to the needs, just satisfy that the projection of the first hole sections 13 of the adjacent rows on the extending direction of the substrate edge overlaps each other. Moreover, the row number of the first hole sections 13 is not constant, just equal to or greater than two. The first hole sections 13 of the barrier layer 12 are formed by etching an inorganic material, so the first hole sections 13 are further filled with an organic material to satisfy the needs of manufacturing process.

In this way, even one of hole sections not be etched cleanly, the adjacent hole section could make up to achieve the crack prevention, and the production yield could be improved.

Figure 2:
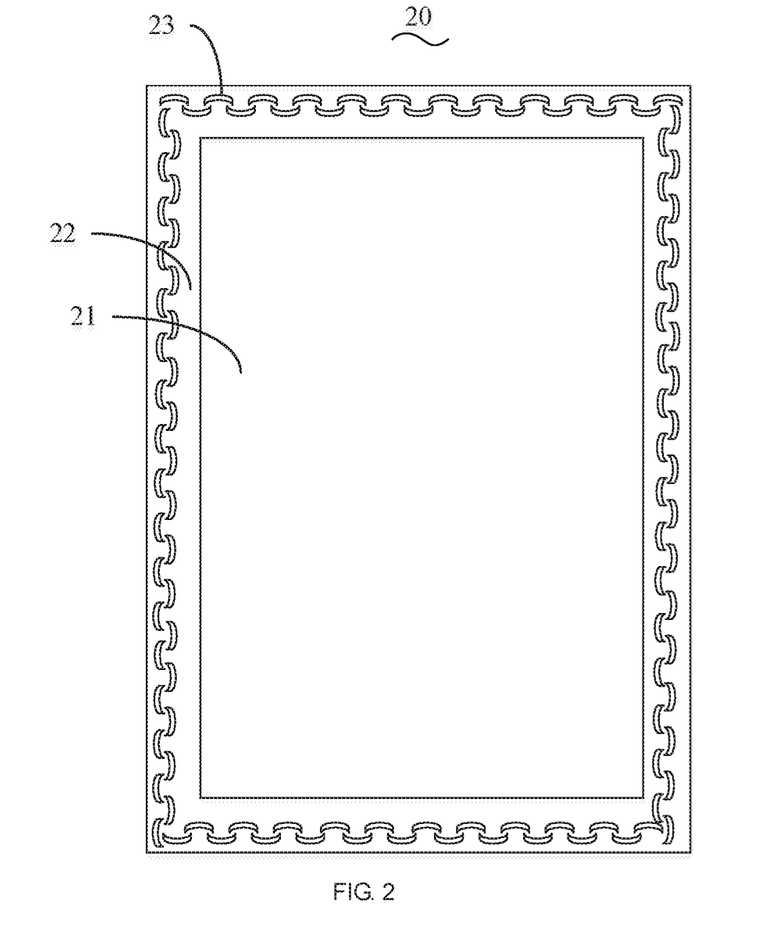
FIG. 2 is a structural schematic view of a display substrate according to the second embodiment of the disclosure.

As shown in FIG. 2, FIG. 2 is a structural schematic view of a display substrate according to the second embodiment of the disclosure. In this embodiment, the display substrate 20 includes a display area 21 and a barrier layer 22.

The display area 21 is located inside the display substrate 20, the barrier layer 22 is located between the display area 21 and a substrate edge of the display substrate 20. Wherein the barrier layer 22 includes two rows of first hole sections 23 arranged alternately on a direction from the display area 21 to the substrate edge, each row of the first hole sections 23 includes at least two first hole sections 23 arranged alternately on an extending direction of the substrate edge, and a projection of the first hole sections 23 of the adjacent rows on the extending direction of the substrate edge overlaps each other.

In this embodiment, the first hole sections 23 are in an arc shape, facing directions of arc tops of the first hole sections 23 of the adjacent rows are opposite to each other. The barrier layer 22 is configured to prevent a crack formed on the substrate edge from extending to the display area 21, wherein the crack between two of the first hole sections 23 adjacent to each other in the same row extending to the display area 21 is blocked by the first hole sections 23 of the adjacent row, the barrier layer 22 is made of an inorganic material, and the first hole sections 23 are further filled with an organic material.

Figure 3:
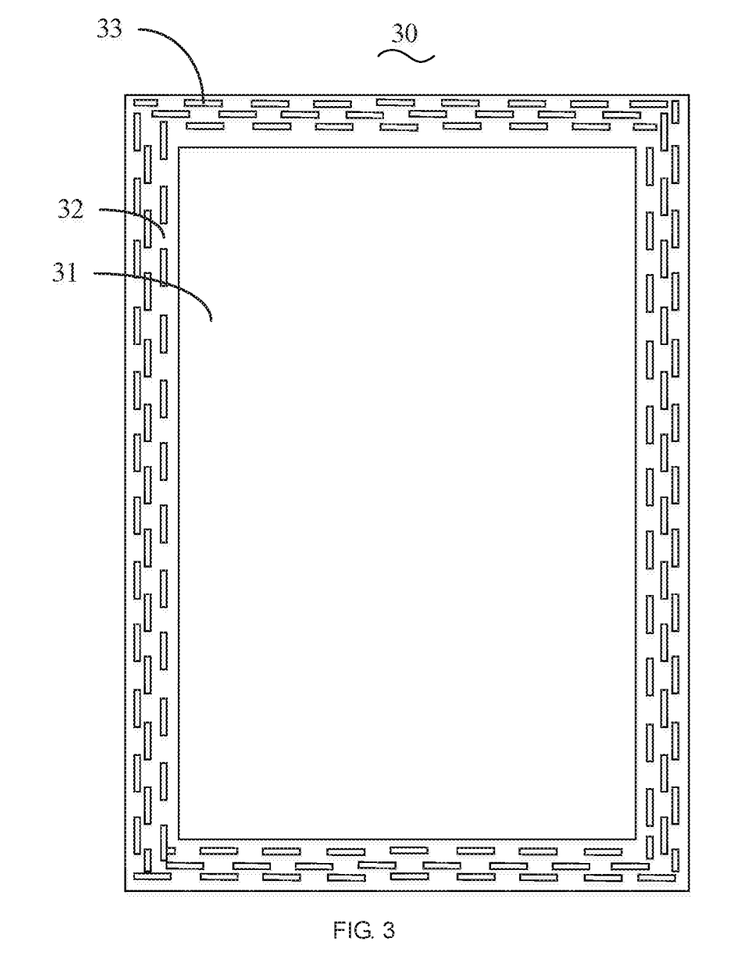
FIG. 3 is a structural schematic view of a display substrate according to the third embodiment of the disclosure.

As shown in FIG. 3, FIG. 3 is a structural schematic view of a display substrate according to the third embodiment of the disclosure. In this embodiment, the display substrate 30 includes a display area 31 and a barrier layer 32.

The display area 31 is located inside the display substrate 30, the barrier layer 32 is located between the display area 31 and a substrate edge of the display substrate 30. Wherein the barrier layer 32 includes three rows of first hole sections 33 arranged alternately on a direction from the display area 31 to the substrate edge, each row of the first hole sections 33 includes at least two first hole sections 33 arranged alternately on an extending direction of the substrate edge, and a projection of the first hole sections 33 of the adjacent rows on the extending direction of the substrate edge overlaps each other.

In this embodiment, the first hole sections 33 are in a straight-line shape. However, it is also conceivable to arrange the first hole sections 33 in three rows in the second embodiment or to add one or more rows of the first hole sections 33 in this embodiment or other embodiments. As long as the barrier layer 32 can accommodate, the more the number of rows of the first hole sections 33, the better the crack prevention.

In the same way, the barrier layer 32 is configured to prevent a crack formed on the substrate edge from extending to the display area 31, wherein the crack between two of the first hole sections 33 adjacent to each other in the same row extending to the display area 31 is blocked by the first hole sections 33 of the adjacent row, the barrier layer 32 is made of an inorganic material, and the first hole sections 33 are further filled with an organic material.

Figure 4:
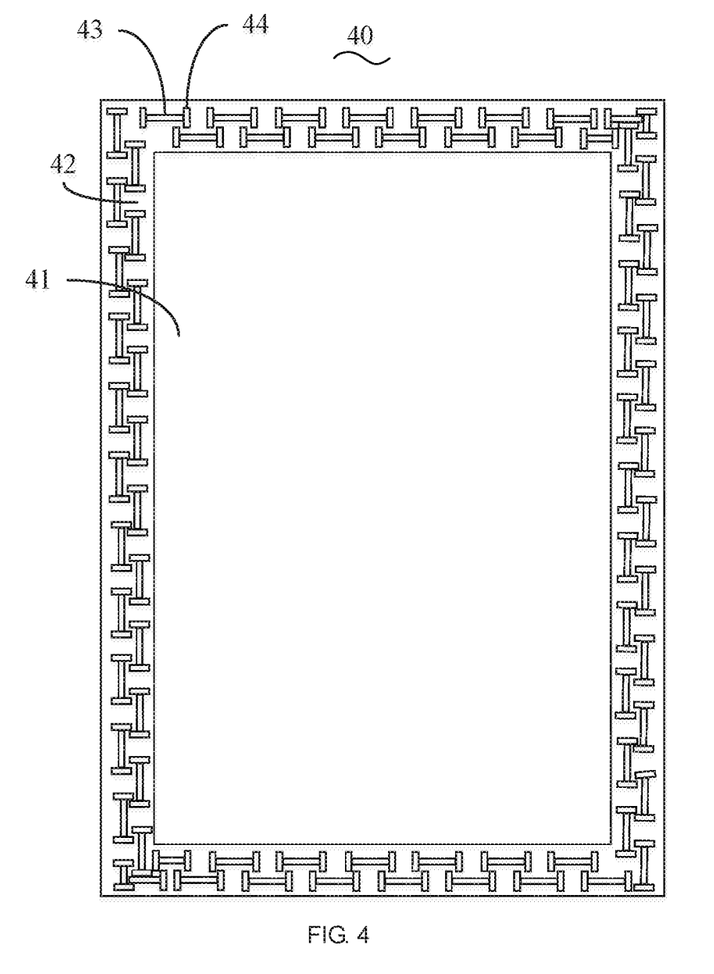
FIG. 4 is a structural schematic view of a display substrate according to the fourth embodiment of the disclosure.

As shown in FIG. 4, FIG. 4 is a structural schematic view of a display substrate according to the fourth embodiment of the disclosure. In this embodiment, the display substrate 40 includes a display area 41 and a barrier layer 42.

The display area 41 is located inside the display substrate 40, the barrier layer 42 is located between the display area 41 and a substrate edge of the display substrate 40. Wherein the barrier layer 42 includes two rows of first hole sections 43 arranged alternately on a direction from the display area 41 to the substrate edge, each row of the first hole sections 43 includes at least two first hole sections 43 arranged alternately on an extending direction of the substrate edge, and a projection of the first hole sections 43 of the adjacent rows on the extending direction of the substrate edge overlaps each other.

In this embodiment, the barrier layer 42 further includes a plurality of second hole sections 44, the second hole sections 44 respectively connect two ends of the first hole sections 43 and are arranged cross each other. The first hole sections 43 and the second hole sections 44 are respectively in a straight-line shape, a longitudinal direction of the first hole sections 43 is perpendicular to a longitudinal direction of the second hole sections 44, and a length size of the second hole sections 44 is larger than a width size of the first hole sections 43.

The barrier layer 42 is configured to prevent a crack formed on the substrate edge from extending to the display area 41, wherein the crack between two of the first hole sections 43 adjacent to each other in the same row extending to the display area 41 is blocked by the first hole sections 43 of the adjacent row.

Wherein the barrier layer 42 is made of an inorganic material, and the first hole sections 43 are further filled with an organic material.

In addition, although only two rows of the first hole sections 43 are provided in this embodiment, multiple rows of first hole sections 43 may be provided in other embodiments, and both ends of each of the first hole sections 43 may connect to the second hole sections 44, so the crack prevention could be better.

Figure 5:
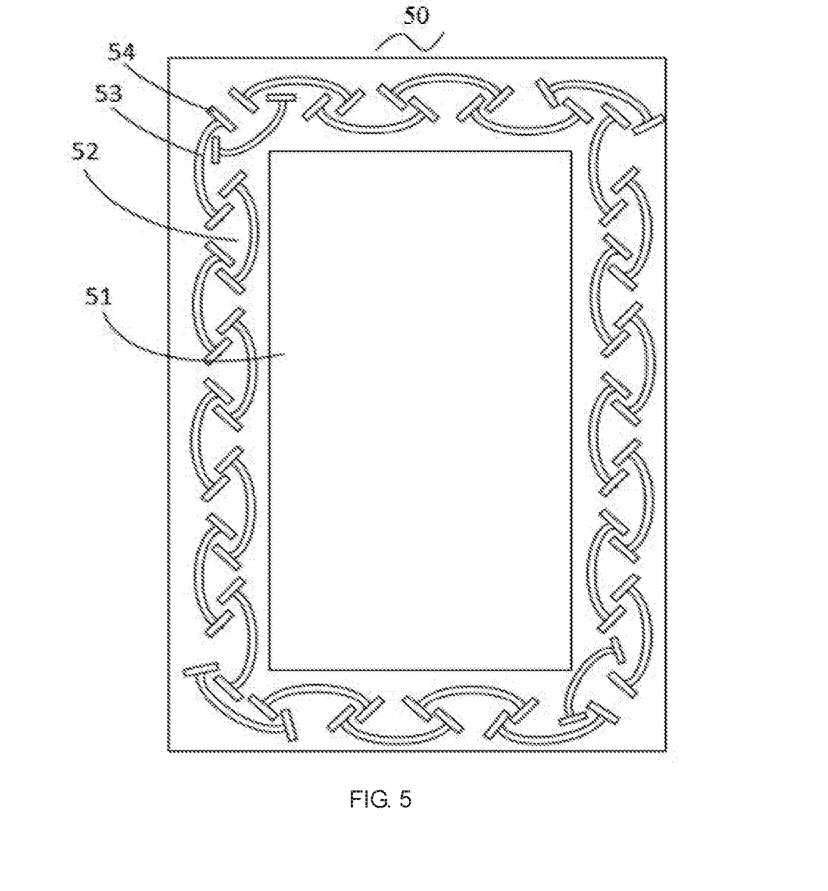
FIG. 5 is a structural schematic view of a display substrate according to the fifth embodiment of the disclosure.

As shown in FIG. 5, FIG. 5 is a structural schematic view of a display substrate according to the fifth embodiment of the disclosure. In this embodiment, the display substrate 50 includes a display area 51 and a barrier layer 52.

The display area 51 is located inside the display substrate 50, the barrier layer 52 is located between the display area 51 and a substrate edge of the display substrate 50. Wherein the barrier layer 52 includes two rows of first hole sections 53 arranged alternately on a direction from the display area 51 to the substrate edge, each row of the first hole sections 53 includes at least two first hole sections 53 arranged alternately on an extending direction of the substrate edge, and a projection of the first hole sections 53 of the adjacent rows on the extending direction of the substrate edge overlaps each other.

In this embodiment, the first hole sections 53 are in an arc shape, facing directions of arc tops of the first hole sections 53 of the adjacent rows are opposite to each other. The barrier layer 52 further includes a plurality of second hole sections 54, the second hole sections 54 respectively connect two ends of the first hole sections 53 and are arranged cross each other. The second hole sections 54 are in a straight-line shape, a longitudinal direction of the second hole sections 54 is arranged along a radial direction of the first hole sections 53, and a length size of the second hole sections 54 is larger than a radius size of the first hole sections 53.

Wherein the barrier layer 52 is made of an inorganic material, and the first hole sections 53 are further filled with an organic material. The barrier layer 52 is configured to prevent a crack formed on the substrate edge from extending to the display area 51, wherein the crack between two of the first hole sections 53 adjacent to each other in the same row extending to the display area 51 is blocked by the first hole sections 53 of the adjacent row.

In addition, although only two rows of the first hole sections 53 are provided in this embodiment, multiple rows of first hole sections 53 may be provided in other embodiments, and both ends of each of the first hole sections 53 may connect to the second hole sections 54, so the crack prevention could be better.

In the above embodiments, before the display substrate is not cut, the first hole sections of another layer may be further provided at the edge of the cutting line for double insurance. In addition, in the same display substrate, the shapes of the first hole sections are not necessarily the same, and two or more than two shapes may exist. Also, a part of the first hole sections may be provided, and a part of the first hole sections and the second hole sections may be provided. In addition, not all the first hole sections are provided at four sides, and the first hole sections may be determined according to a specific bending direction or a crack-generating edge.

Figure 6:
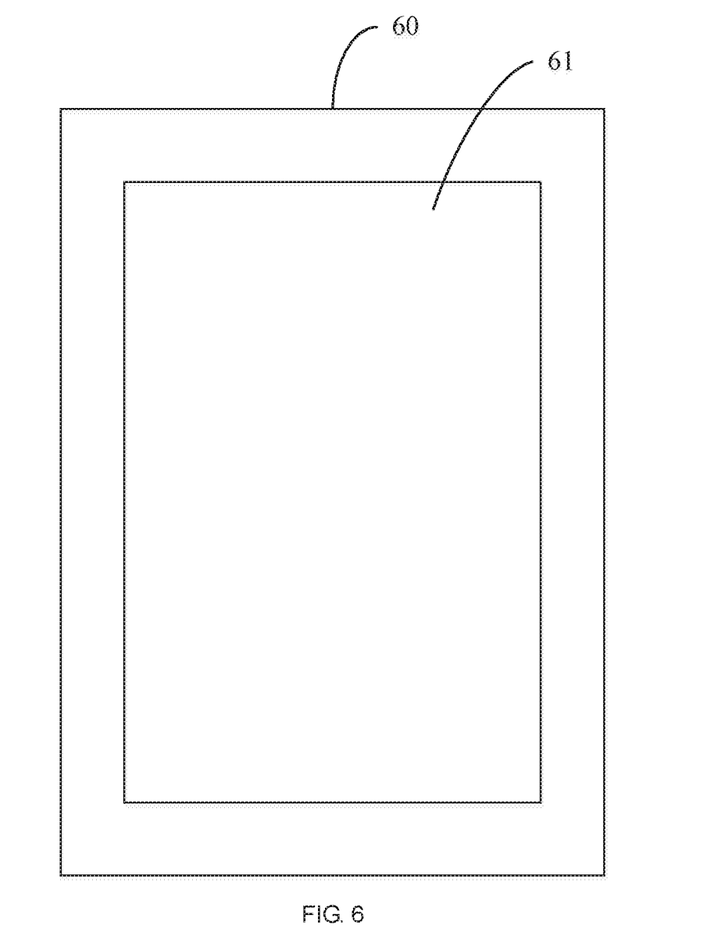
FIG. 6 is a structural schematic view of a display device according to another embodiment of the disclosure.

As shown in FIG. 6, FIG. 6 is a structural schematic view of a display device according to another embodiment of the disclosure. In this embodiment, the display device 60 includes a display substrate 61.

Wherein the display substrate 61 may be the display substrate of the above-mentioned embodiments.

Furthermore, it should be noted that the number and the size of the first hole sections and the second hole sections are not limited, that could be adjusted according to the needs, the drawings are only for illustration, not for limitation of the number and the size.

The beneficial effects of the disclosure are as follows, compare to the conventional technology, the embodiments of the disclosure provide a display substrate with a barrier layer including at least two rows of first hole sections, and a projection of the first hole sections of the adjacent rows on the extending direction of the substrate edge overlaps each other. Therefore, even one of first hole sections not be etched cleanly, the adjacent first hole section could make up to achieve the crack prevention, and the production yield could be improved.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A display substrate, comprising
a display area, located inside the display substrate; and
a barrier layer, located between the display area and a substrate edge of the display substrate;
wherein the barrier layer includes at least two rows of first hole sections arranged alternately on a direction from the display area to the substrate edge, each row of the first hole sections includes at least two first hole sections arranged alternately on an extending direction of the substrate edge,
wherein a projection of the first hole sections of the adjacent rows on the extending direction of the substrate edge overlaps each other, the barrier layer is configured to prevent a crack formed on the substrate edge from extending to the display area,
wherein the crack between two of the first hole sections adjacent to each other in the same row extending to the display area is blocked by the first hole sections of the adjacent row, the barrier layer is made of an inorganic material, and the first hole sections are further filled with an organic material;
wherein the barrier layer further includes a plurality of second hole sections, the second hole sections respectively connect two ends of the first hole sections and are arranged cross each other; and
wherein the first hole sections are in an arc shape, the second hole sections are in a straight-line shape, a longitudinal direction of the second hole sections is arranged along a radial direction of the first hole sections, and a length size of the second hole sections is larger than a radius size of the first hole sections.

2. The display substrate according to claim 1, wherein the facing directions of arc tops of the first hole sections of two adjacent rows are opposite to each other.

3. The display substrate according to claim 1, wherein the second hole sections are further filled with the organic material.

4. A display substrate, comprising:
a display area, located inside the display substrate; and
a barrier layer, located between the display area and a substrate edge of the display substrate;
wherein the barrier layer includes at least two rows of first hole sections arranged alternately on a direction from the display area to the substrate edge, each row of the first hole sections includes at least two first hole sections arranged alternately on an extending direction of the substrate edge,
wherein a projection of the first hole sections of the adjacent rows on the extending direction of the substrate edge overlaps each other;
wherein the barrier layer further includes a plurality of second hole sections, the second hole sections respectively connect two ends of the first hole sections and are arranged cross each other; and
wherein the first hole sections are in an arc shape, the second hole sections are in a straight-line shape, a longitudinal direction of the second hole sections is arranged along a radial direction of the first hole sections, and a length size of the second hole sections is larger than a radius size of the first hole sections.

5. The display substrate according to claim 4, wherein the barrier layer is configured to prevent a crack formed on the substrate edge from extending to the display area, wherein the crack, extending to the display area between two of the first hole sections adjacent to each other in the same row, is blocked by the first hole sections of the adjacent row.

6. The display substrate according to claim 4, wherein the barrier layer is made of an inorganic material, and the first hole sections are further filled with an organic material.

7. The display substrate according to claim 4, wherein the facing directions of arc tops of the first hole sections of two adjacent rows are opposite to each other.

8. The display substrate according to claim 4, wherein the barrier layer is made of an inorganic material, and the first hole sections and the second hole sections are further filled with an organic material.

9. A display device, comprising:
a display substrate, comprising:
a display area, located inside the display substrate; and
a barrier layer, located between the display area and a substrate edge of the display substrate;
wherein the barrier layer includes at least two rows of first hole sections arranged alternately on a direction from the display area to the substrate edge, each row of the first hole sections includes at least two first hole sections arranged alternately on an extending direction of the substrate edge,
wherein a projection of the first hole sections of the adjacent rows on the extending direction of the substrate edge overlaps each other;
wherein the barrier layer further includes a plurality of second hole sections, the second hole sections respectively connect two ends of the first hole sections and are arranged cross each other; and
wherein the first hole sections are in an arc shape, the second hole sections are in a straight-line shape, a longitudinal direction of the second hole sections is arranged along a radial direction of the first hole sections, and a length size of the second hole sections is larger than a radius size of the first hole sections.

10. The display device according to claim 9, wherein the barrier layer is configured to prevent a crack formed on the substrate edge from extending to the display area, wherein the crack, extending to the display area between two of the first hole sections adjacent to each other in the same row, is blocked by the first hole sections of the adjacent row.

11. The display device according to claim 9, wherein the barrier layer is made of an inorganic material, and the first hole sections are further filled with an organic material.

12. The display device according to claim 9, wherein the facing directions of arc tops of the first hole sections of two adjacent rows are opposite to each other.

* * * * *